Figure 3:
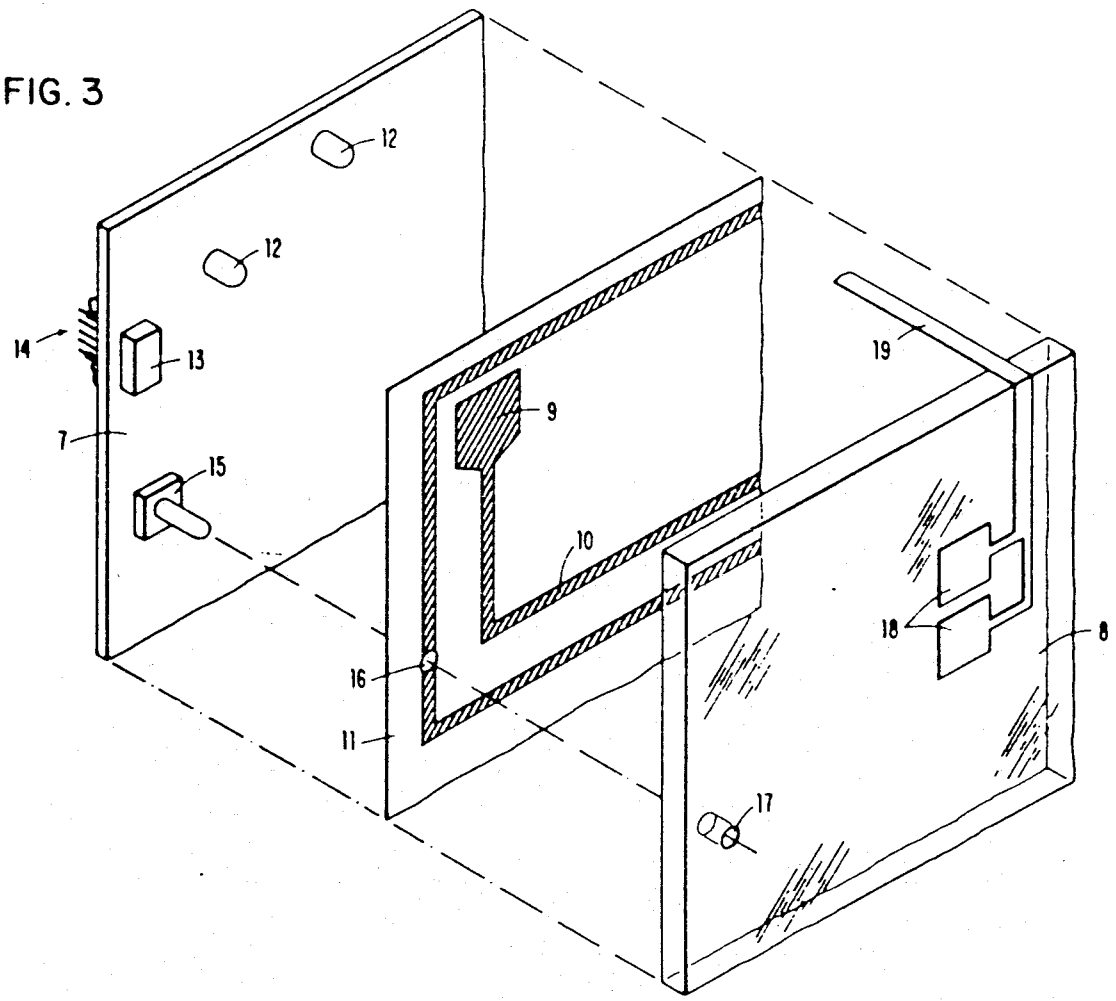

United States Defensive Publication [19] (H) [11] T103,204

Dorrell et al. [43] Jul. 5, 1983

[54] PROCESS CONTROL DISPLAY PANEL

[76] Inventors. Carter E. Dorrell, 1113 10th St., Boulder, Colo 80302; Donald E. Gutscher, 412 Sumner St., Longmont, Colo 80501; Carol J. Huffman, 2224-B Mapleton Ave., Boulder, Colo 80302

[21] Appl No.: 348,577

[22] Filed: Feb. 12, 1982

[51] Int. Cl.[3] ..... H05K 1/00; H05K 1/18

[52] U.S. Cl. ..... 428/42; 174/68.5; 428/901

[57] ABSTRACT

An easily modified, brilliantly backlit, switch controlled panel graphically represents a process. An operator panel includes a frame holding a light-transmitting screen in front of circuit boards connected to a computer and to the controlled process. The screen displays symbols, placed on the screen with self-sticking tape, representing process steps and controls, transparent touch-sensitive switches, lights, illuminated digital displays, and the like. The switches, lights and displays connect to the circuit boards.

5 Claims, 5 Sheets Drawing,

7 Pages Specification

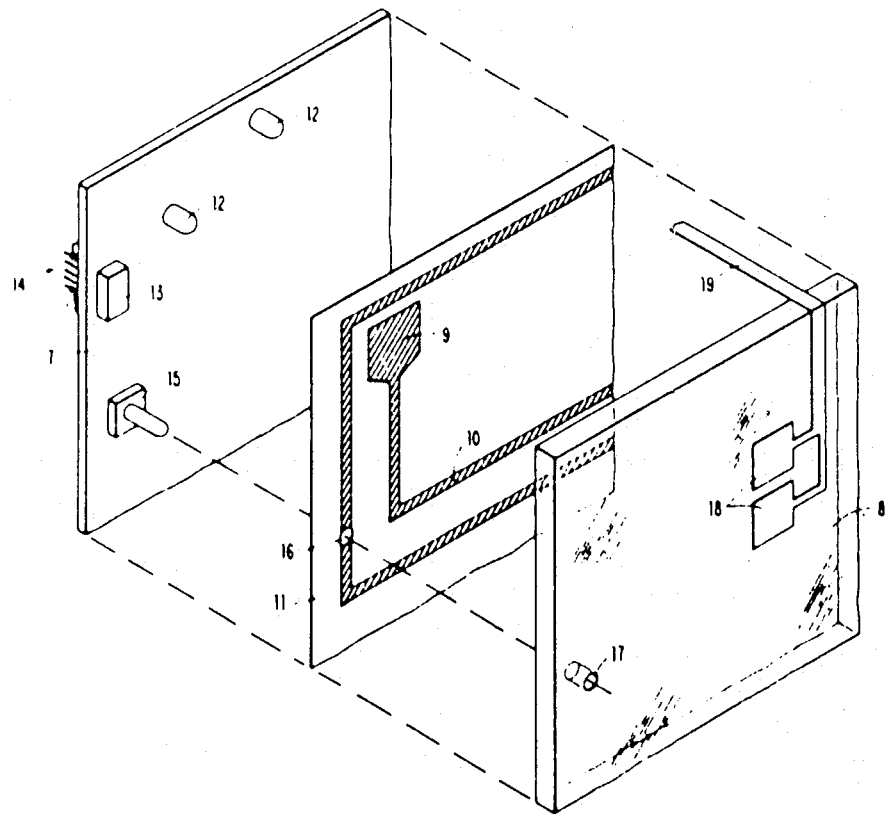

The file of this unexamined application may be inspected and copies thereof may be purchased (849 O.G. 1221, Apr. 9, 1968)